United States Patent [19]

Ho et al.

[11] Patent Number: 6,120,322

[45] Date of Patent: Sep. 19, 2000

[54] MEMORY CARD CONNECTION DEVICE

[75] Inventors: Yu-Ming Ho, Pen-Chiao; Kevin Chou, Taipei Hsien, both of Taiwan

[73] Assignee: Hon Hai Precision Ind. Co., Ltd., Taipei Hsien, Taiwan

[21] Appl. No.: 09/290,772

[22] Filed: Apr. 13, 1999

[30] Foreign Application Priority Data

Aug. 31, 1998 [TW] Taiwan .................................. 87214314

[51] Int. Cl.[7] .................................................. H01R 13/62
[52] U.S. Cl. ........................................................ 439/541.5
[58] Field of Search ........................ 439/64, 159, 540.1, 439/541.5

[56] References Cited

U.S. PATENT DOCUMENTS

| | | | |
|---|---|---|---|
| 5,299,089 | 3/1994 | Lwee ..................................... | 439/541.5 |
| 5,324,204 | 6/1994 | Lwee ..................................... | 439/541.5 X |
| 5,334,046 | 8/1994 | Brouillette et al. .................. | 439/541.5 |
| 5,643,001 | 7/1997 | Kaufman et al. ................. | 439/541.5 X |
| 5,662,482 | 9/1997 | Shin .................................... | 439/541.5 X |

*Primary Examiner*—Stanley J. Witkowski

*Attorney, Agent, or Firm*—Wei Te Chung

[57] ABSTRACT

A memory card connection device includes an upper card connector stacked on a lower card connector. The card connectors have a rear connector section from which two guide racks extend toward a front card receiving port thereby defining therebetween a first space sufficient for accommodating a type I or type II memory card. A single cover plate is positioned on and fixed to the upper card connector. The cover plate has a low level section directly fixed to the rear connector section of the upper card connector and a high level section positioned above the guide racks and connected to the low level section by a riser panel thereby forming a step-like configuration. The high level section of the cover plate is distant from the upper card connector thereby defining a second space therebetween in communication with the first space of the upper card connector thereby defining an enlarged overall space for receiving a type III memory card without interfering with the lower card connector. The cover plate has two spaced extensions rotatably supporting door panels thereon associated with the card receiving ports. The door panels are spring-biased for exposing/blocking the card receiving ports.

3 Claims, 5 Drawing Sheets

MEMORY CARD CONNECTION DEVICE

BACKGROUND OF THE INVENTION

1. Field of the Invention

The present invention generally relates to a memory card connection device having two card connectors stacked on each other capable of simultaneously receiving two memory cards and, in particular, to a memory card connection device which is capable of simultaneously receiving a type III memory card (hard disk drive package) and a type I or type II memory card.

2. The Prior Art

In accordance with PCMCIA, memory cards that are releasably connectable to a computer system are classified as type I, II or III. All three types of memory cards have the same front connection section and side guidance sections. However, these memory cards have different rear sections which have a maximum vertical dimension (thickness) of 3.3 mm, 5.0 mm and 10.5 mm, respectively.

To accommodate the different dimensions of the three types of memory cards, a memory card connection device or card connector is provided with an enlarged insertion port or opening. An example is disclosed in U.S. Pat. No. 5,176,523 wherein the top cover is provided with a cutout at the insertion port for accommodating the large rear section dimension of the type III memory card.

Memory card connection devices that allow two memory cards to be simultaneously connected to a single memory card connection device are also available in the market. Such a memory card connection device usually comprises two card connectors, each capable of receiving one memory card, stacked on each other. Examples are disclosed in U.S. Pat. Nos. 5,176,523 (mentioned above), 5,324,204 and 5,401,176. Such a stacked structure of the '523 patent, however, is only capable of accommodating two type I or II cards and no type III card may be used. In the '204 and '176 devices, a continuous space is defined within the two connectors for accommodating the type III memory card or, alternatively, for accommodating two of the type I or II cards. However, the two devices cannot simultaneously receive a type III memory card and a type I or II memory card.

In addition, the memory card connection device currently available in the market requires computer manufacturers to add an inner casing or support frame inside the computer enclosure to define a space for accommodating the memory card connection device thereby increasing manufacturing costs.

It is thus desirable to have a memory card connection device which overcomes the problems discussed above.

SUMMARY OF THE INVENTION

Accordingly, an object of the present invention is to provide a memory card connection device which allows two memory cards of different types to be simultaneously inserted therein.

Another object of the present invention is to provide a memory card connection device which has a cover plate serving as an outer casing for enclosing the connectors therein, the cover plate having a simple construction thereby reducing manufacturing costs.

A further object of the present invention is to provide a memory card connection device which has door panels for blocking card receiving ports of the memory card connection device for preventing debris and contaminants from entering the connection device.

To achieve the above objects, a memory card connection device in accordance with the present invention comprises an upper card connector stacked on a lower card connector. The card connectors have a rear connector section from which two guide racks extend toward a front card receiving port thereby defining therebetween a first space sufficient for accommodating a type I or type II memory card. A single cover plate is positioned on and fixed to the upper card connector. The cover plate has a low level section directly fixed to the rear connector section of the upper card connector and a high level section positioned above the guide racks and connected to the low level section by a riser panel thereby forming a step-like configuration. The high level section of the cover plate is distant from the upper card connector thereby defining a second space therebetween in communication with the first space of the upper card connector thereby defining an enlarged overall space for receiving a type III memory card without interfering with the lower card connector. The cover plate has two spaced extensions rotatably supporting door panels thereon associated with the card receiving ports. The door panels are spring-biased for exposing/blocking the card receiving ports.

BRIEF DESCRIPTION OF THE DRAWINGS

The present invention will be apparent to those skilled in the art by reading the following description of a preferred embodiment thereof, with reference to the accompanying drawings, in which.

DETAILED DESCRIPTION OF THE PREFERRED EMBODIMENT

Figure 1:
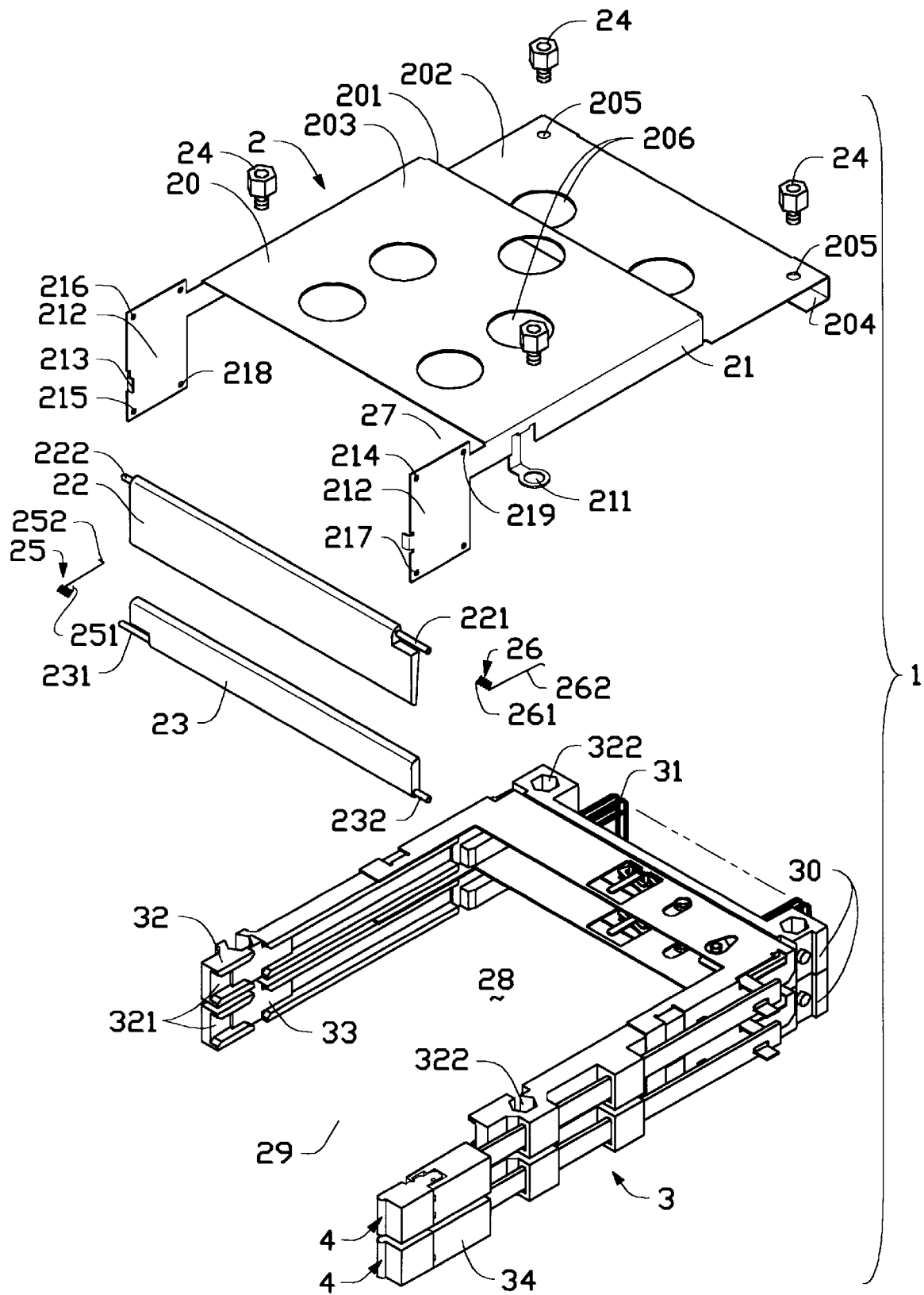
FIG. 1 is an exploded view showing a memory card connection device constructed in accordance with the present invention.
Figure 2:
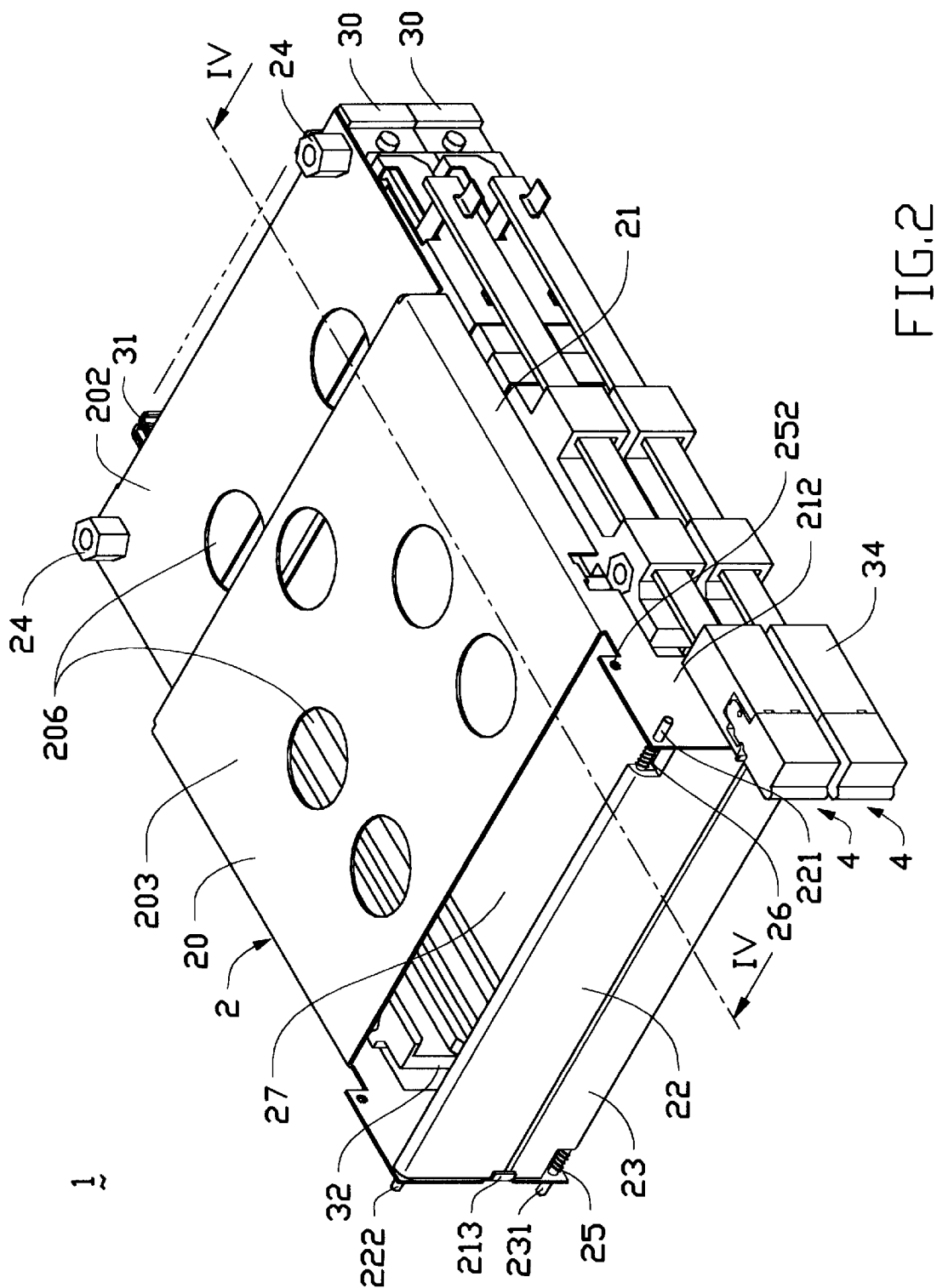
FIG. 2 is an assembled view of FIG. 1.

Referring to the drawings and in particular to FIGS. 1 and 2, wherein a memory card connection device constructed in accordance with the present invention, generally designated by reference numeral 1, is shown, the memory card connection device 1 of the present invention comprises a connector assembly 3 comprising two card connectors 4 stacked on each other and a casing 2 for enclosing the connector assembly 3.

Figure 4A:
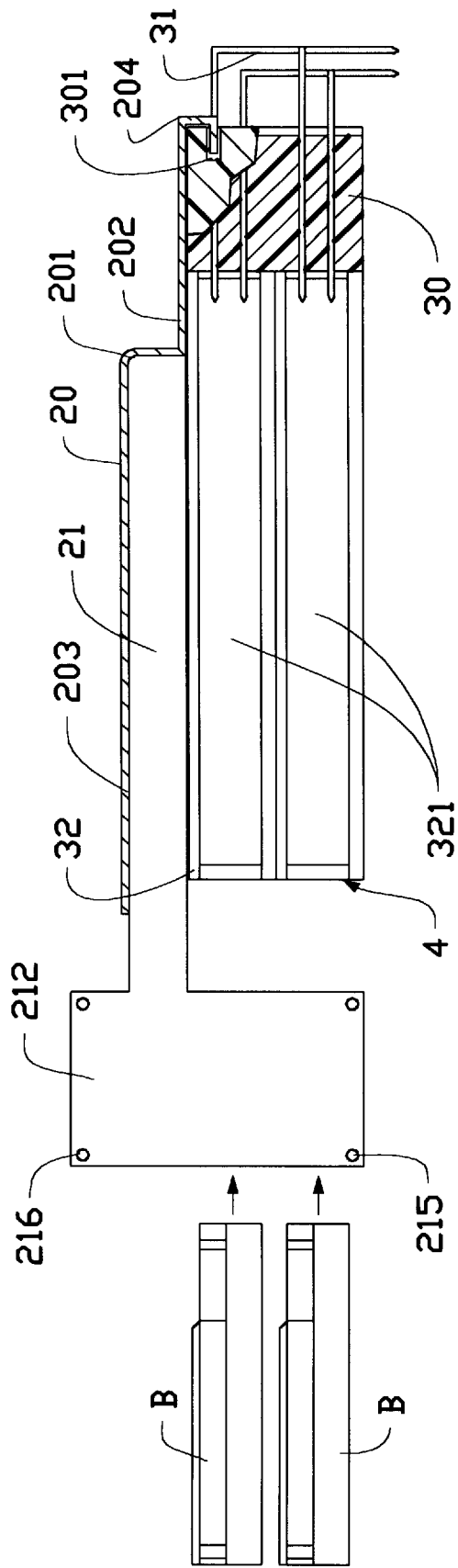
FIGS. 4A and 4B are cross-sectional views, taken along line IV—IV of FIG. 2, demonstrating the memory card connection device of the present invention receiving different memory cards.

Each card connector 4 has an insulative body 30 defining a plurality of passageways (not labeled) therein for receiving conductive pins 31 with engaging ends of the pins 31 extending beyond a front side of the body 30. The body 30 has two opposite ends from each of which a guide rack 32 extends frontward to define therebetween a front space 28 for accommodating a memory card (indicated by reference characters "A" or "B" in FIGS. 4A and 4B) whereby the memory card is electrically engaged with the engaging ends of the pins 31. The guide rack 32 forms a rail 321 co-extensive therewith for guiding the insertion/withdrawal of the memory card into/out of the card connector 4.

The body 30 defines a rear connector section of the memory card connection device 1, while the guide racks 32 extending therefrom define a front card receiving port 29 through which the memory card is received into the front space 28 and moved toward the rear connector section. Grounding members 33 are provided in the rails 321 for retaining the memory card and providing the memory card with a grounding connection. A card release mechanism 34 is provided on one of the guide racks 32 of each card connector 4 for releasing the memory card therefrom.

The card connectors 4 are provided with holes 322 for receiving bolts 24 thereby securing the two card connectors 4 together.

Figure 3:
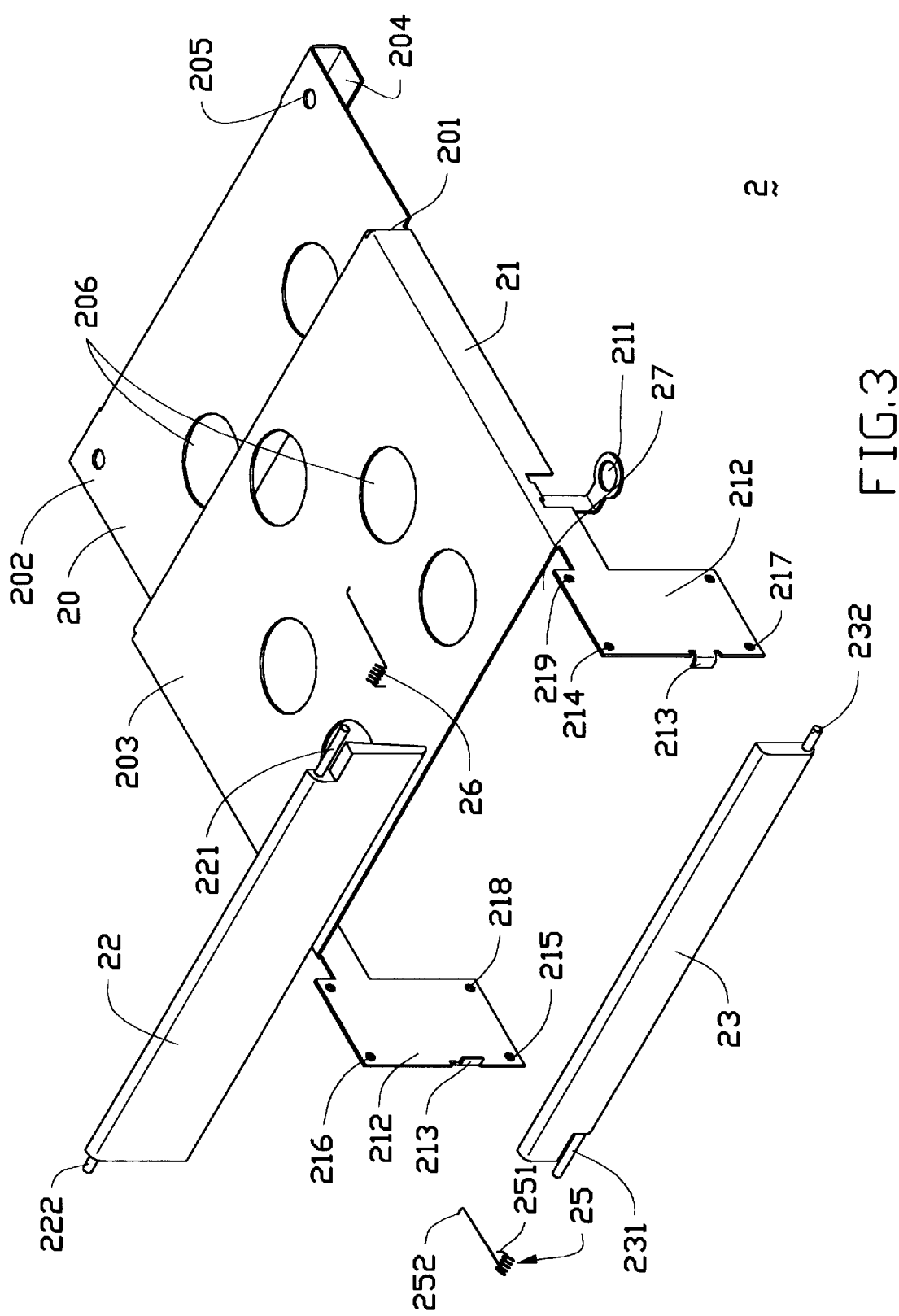
FIG. 3 is an exploded view of a casing of the memory card connection device in accordance with the present invention.

Referring to FIGS. 1 and 3, the casing 2 of the memory card connection device 1 comprises a step-like top cover plate 20 having a first low section panel 202 directly positioned on and fixed to the upper card connector 4 and a second high section panel 203 which is vertically distant from the low panel 202 and connected by a riser panel 201. The high panel 203 comprises two side walls 21 extending from opposite sides thereof for accommodating the vertical distance between the low panel 202 and the high panel 203 and to support the high panel 203 on the upper card connector 4. Bolt holes 205, 211 are provided on the casing 2 for receiving bolts 24 which secure the casing 2 to the upper card connector 4.

The casing 2 is secured to the upper card connector 4 whereby the low panel 202 is directly fixed to the rear connector section thereof by means of the bolts 24 received in the holes 205 and the high panel 203 is positioned above the front card receiving port and fixed to the guide racks 32 by means of the bolts 24 received in the holes 211. The low panel 202 shields the pins 31.

Figure 4B:
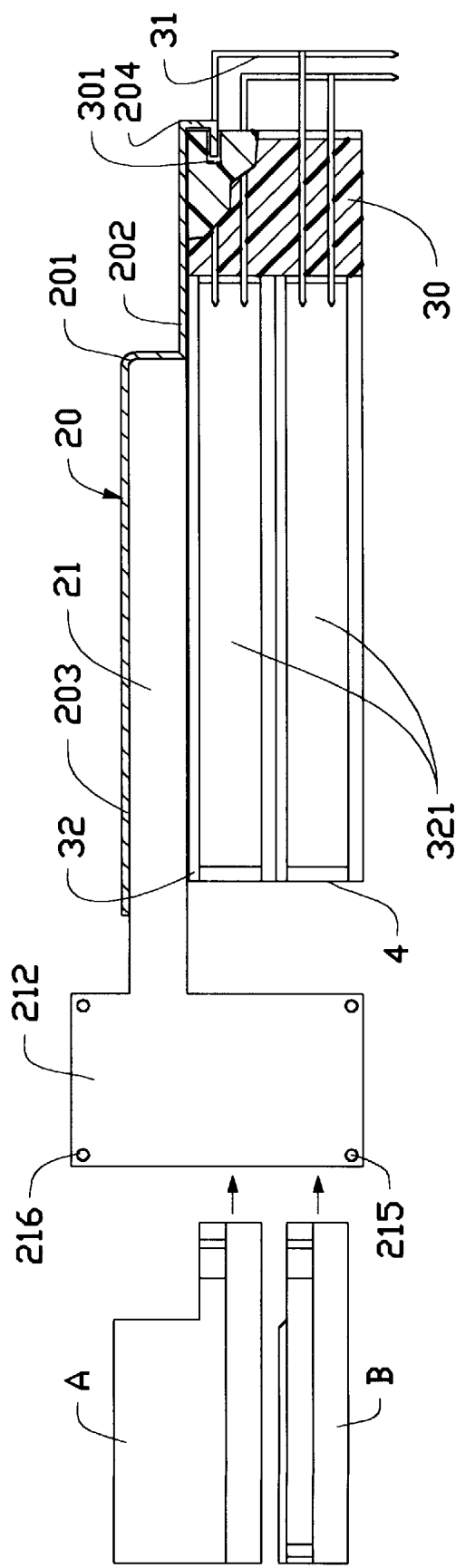

The distance between the high panel 203 and the low panel 202 is sufficient to accommodate the dimension difference between memory cards of different types. Thus, the high panel 203 defines an additional space (not labeled) which is in communication with the front space 28 of the upper card connector. Theses two spaces together are sufficient to receive a type III memory card which has the largest rear section dimension while the lower card connector is not interfered with thereby being capable of simultaneously receiving a memory card of either type I or type II as shown in FIG. 4B in which a type III memory card is designated by "A" and a type I or II memory card is designated by "B". It is quite apparent that the upper card connector 4 may also be used to receive and connect a type I or II memory card. This is demonstrated in FIG. 4A in which two memory cards of either type I or II, both designated "B", are received in the two card connectors 4 of the memory card connection device 1 of the present invention.

The low panel 202 is provided with U-shaped extensions 204 which engage corresponding slots 301 defined in the body 30 of the upper card connector 4 for retaining the casing 2 on the connector assembly 3. Holes 206 for facilitating heat dissipation are provided on both the low panel 202 and the high panel 203. The high panel 203 of the cover plate 20 has two front extensions 212 having a vertical dimension larger than the vertical dimension of upper and lower card connectors 4. The extensions 212 have two sets of pivot holes 214, 217 and 216, 215 respectively provided thereon.

An upper door panel 22 has two pivot pins 221, 222 rotatably received in the pivot holes 216, 214 of the extensions 212 thereby rendering the upper door member 22 rotatable with respect to the casing 2 between a closed position at which the upper door member 22 blocks the card receiving port 29 of the upper card connector 4 and thus shields the front space 28 thereof, and an open position at which the upper door member 2 is moved away from the card receiving port 29 of the upper card connector 4 and the front space 28 is exposed. The pivot holes 216, 214 are distant from a front edge of the high panel 203 and a spacing 27 sufficient for accommodating the upper door panel 22 when the upper door panel 22 is at the open position is defined between the extensions 212.

A stop 213 is provided on each of the extensions 212 for engaging with the upper door panel 22 at the closed position. Biasing means, such as a torsional spring 26, is provided to bias the upper door panel 22 toward the closed position. The torsional spring 26 has a first end 261 supported by the pivot pins 221, 222 of the upper door panel 22 and a second hooked end 262 engaging with an aperture 219 defined in one of the extensions 212.

A lower door panel 23 has two pivot pins 231, 232 rotatably received in the pivot holes 215, 217 of the two extensions 212 thereby rendering the lower door panel 23 rotatable with respect to the casing 2 between a closed position at which the lower door panel 23 blocks the card receiving port of the lower card connector 4 and an open position at which the card receiving port of the lower card connector 4 is exposed.

Similar to the upper door panel 22, the lower door panel 23 also engages with the stops 213 at the closed position. Biasing means, such as a torsional spring 25, is provided to bias the lower door panel 23 toward the closed position. The torsional spring 25 has a first end 251 supported by the pivot pins 231, 232 of the lower door panel 23 and a second hooked end 252 engaging with an aperture 218 defined in one of the extensions 212.

The provision of the riser panel 201 allows the high panel 203 and the low panel 202 to be integrated with each other to form the single cover plate 20 which substantially shields the connector assembly 3 completely whereby an excellent shielding effect for the connector assembly 3 may be obtained. Furthermore, no internal casing is required within a computer enclosure to shield and separate the connection assembly 3. The cover plate 20 in accordance with the present invention has a simple structure whereby production costs are low and the manufacturing process is simplified.

Although the present invention has been described with reference to a preferred embodiment thereof, it is apparent to those skilled in the art that a variety of modifications and changes may be made without departing from the scope of the present invention which is intended to be defined by the appended claims.

What is claimed is:

1. A memory card device comprising:
    a connector assembly which is composed of only two stacked upper and lower card connectors, said upper and lower card connectors defining identical bodies each having a rear connector section with a pair of racks extending forwardly therefrom;
    a casing attached to said connector assembly, said casing including a step-like top cover plate having a low first panel directly positioned on and fixed to the upper card connector around the rear connector section thereof, a high second panel vertically distant from the low panel and above a space defined between the pair of racks, and a riser panel connected between said low panel and said high panel, said high panel further including a pair of opposite side walls extending downwardly from two opposite sides thereof and vertically dimensioned to compensate a distance between the low panel and the high panel.

2. The device as defined in claim 1, wherein a pair of front extensions extending forwardly from said pair of side walls, respectively, and at least one door are pivotably mounted thereon for exposing or blocking card receiving ports defined by said upper and lower card connectors.

3. The device as defined in claim 2, wherein the high panel further defines space between said pair of front extensions and said space is dimensioned to be large enough to accommodate the pivotal door therein when said door is in an exposing position.

* * * * *